United States Patent [19]
Nijman

[11] 3,970,802
[45] July 20, 1976

[54] FLEXIBLE CIRCUIT CONNECTING ARRANGEMENT FOR INTERCONNECTION MODULES

[75] Inventor: John Peter Nijman, West Hill, Canada

[73] Assignee: Bunker Ramo Corporation, Oak Brook, Ill.

[22] Filed: Oct. 16, 1974

[21] Appl. No.: 515,274

[52] U.S. Cl............................ 179/98; 317/101 CM; 317/101 F; 339/17 M; 339/18 B
[51] Int. Cl.² .................. H04Q 1/06; H04Q 1/14; H01R 11/00
[58] Field of Search .................. 179/98, 1 PC, 91 R; 339/18 C, 19, 4, 17 C, 18 R, 18 B, 18 P, 151 R, 151 C, 151 M, 17 F; 317/101 F, 101 CE, 101 CM

[56] References Cited
UNITED STATES PATENTS

| | | | |
|---|---|---|---|
| 3,193,731 | 7/1965 | Gerlach et al. | 179/91 R |
| 3,450,950 | 6/1969 | Tarrats | 317/101 CE |
| 3,525,066 | 8/1970 | Magee et al. | 339/17 C |
| 3,566,004 | 2/1971 | Creedon | 179/98 |
| 3,671,811 | 6/1972 | Ezaki | 317/101 CE |
| 3,736,387 | 5/1973 | Thompson et al. | 179/1 PC |
| 3,792,412 | 2/1974 | Madden | 339/17 C |

FOREIGN PATENTS OR APPLICATIONS

| 1,354,708 | 5/1974 | United Kingdom |
|---|---|---|

*Primary Examiner*—Kathleen H. Claffy
*Assistant Examiner*—Randall P. Myers
*Attorney, Agent, or Firm*—William Lohff; F. M. Arbuckle

[57] ABSTRACT

An interconnection module for a termination system, in particular for key telephone termination systems, includes a front panel, a back panel spaced from and secured to the front panel, an array of patch-cord type connector contacts supported in vertical and horizontal rows by and extending through the front panel, and a plurality of separable electrical connectors having one mating part thereof mounted on and extending through the back panel. A vertical row of contacts on the front panel is associated with an electrical connector mounted on the back panel and the individual contacts of such an association are interconnected in the space between the front and back panels by a flexible printed circuit arrangement which is constituted by one or more multi-layer printed circuits.

14 Claims, 6 Drawing Figures

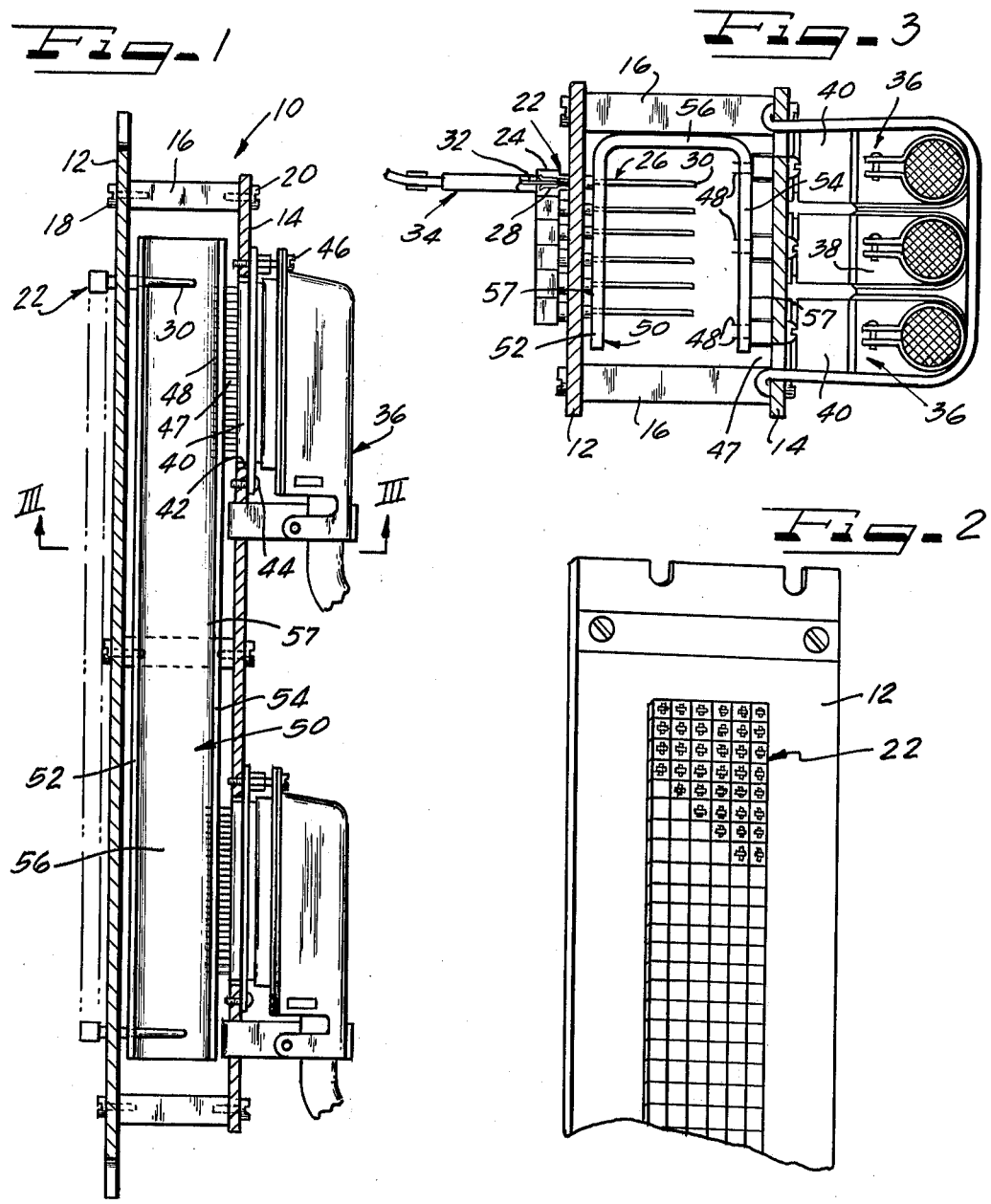
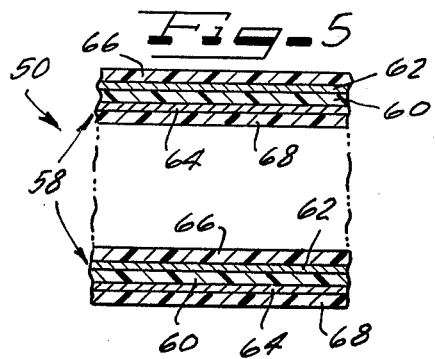

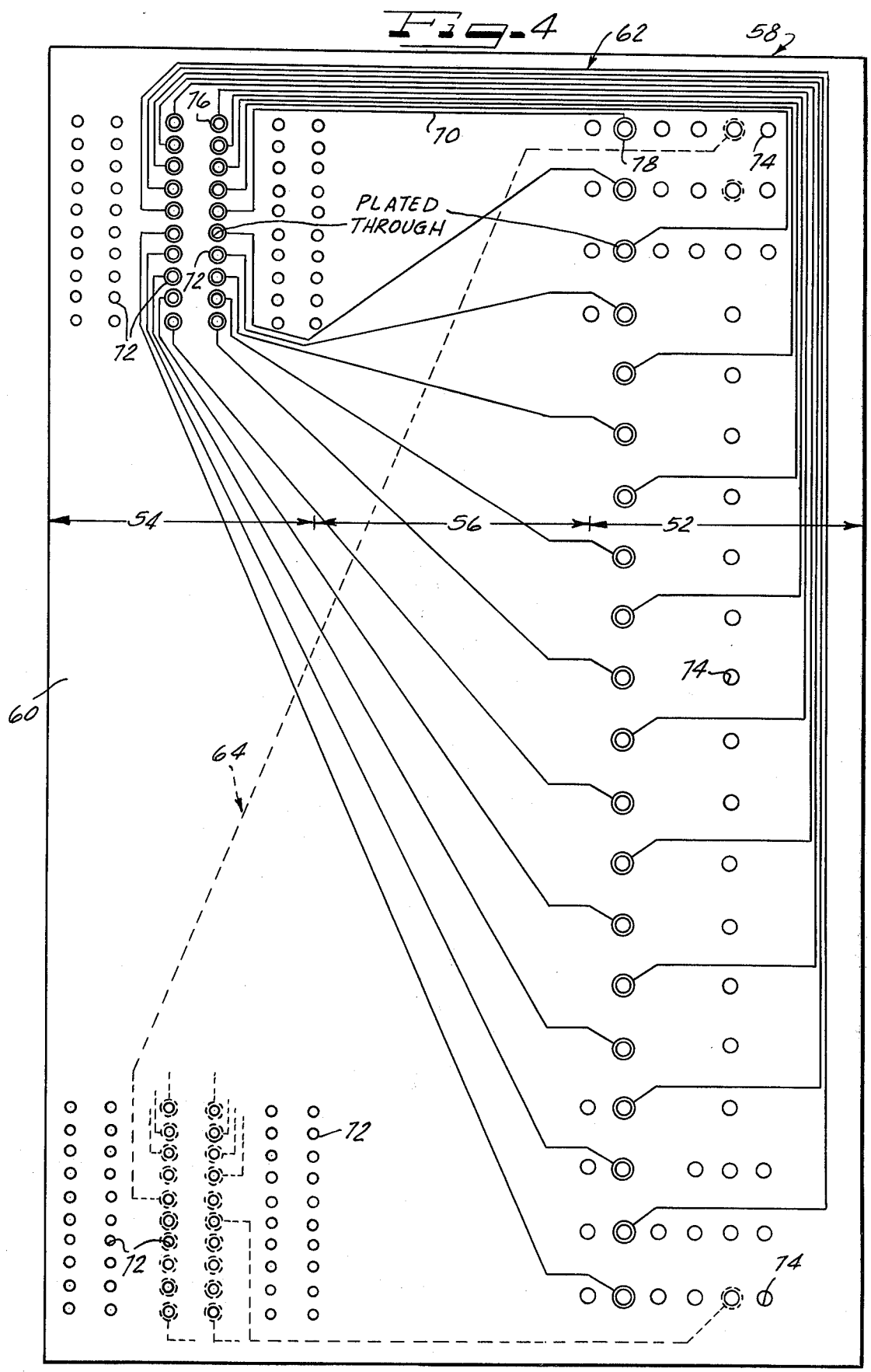

«3,970,802»

FLEXIBLE CIRCUIT CONNECTING ARRANGEMENT FOR INTERCONNECTION MODULES

CROSS REFERENCE TO RELATED APPLICATION

This application is related to an application entitled "Modular Interchange Termination System," of Arie Verhagen, Ser. No. 480,852, filed Jun. 19, 1974.

BACKGROUND OF THE INVENTION

1. Field of the Invention

This invention relates to electrical connection modules for modular interchange termination systems, and in particular to circuit interconnections within an interconnection module.

2. Description of the Prior Art

Arie Verhagen in his U.S. Pat. Application Ser. No. 480,852 discloses a modular interchange termination system for use, in particular, with a key telephone system in which the heart of the termination system includes interconnection modules having a plurality of programmable contacts which may be selectively interconnected by means of plug-in jumper connections, commonly known as patch-cords. The contacts of each of the interconnection modules are arranged in horizontal and vertical rows which bear similar indicia in the form of color coding to aid in the identification of individual lines which bear corresponding color coding for ease of installation and maintenance. The system includes three types of modules of substantially the same construction which are identified as the "green field" which is associated with incoming lines, the "red field" which receives the incoming lines from the green field and is associated with switching equipment to extend the incoming lines and signaling lines toward the key telephones, and the "blue field" which interconnects the red field with the key telephones.

The patch cord contacts are carried on a front panel for ease in selectively programming the system as to line and function. A back panel carries one or more separable electrical connectors thereon, depending on the type of field, for ease in selectively establishing electrical associations for the key telephones, for example, at different physical locations without actually moving a key telephone from one location to another.

In the space between the front panel and the back panel there is a multitude of electrical connections which must be established between individual contacts on the front panel and the contacts of the separable connectors. The use of individual wiring techniques, including wire wrapping techniques, is time consuming and gives rise to the possibility of error which, in turn, is further time consuming in trouble shooting and correction time.

SUMMARY OF THE INVENTION

It is therefore the primary object of the present invention to provide an improved contact interconnection structure within an interconnection module of a modular interchange termination system.

An attendant object of the invention is to improve the interconnection structure within an interconnection module so as to minimize interconnection time within the module during fabrication.

A still further object of the invention is to improve circuit connections within an interconnection module so that wiring errors and the resulting error determination and correction time are eliminated.

Inasmuch as the various functions of key telephones are generally the same from one key telephone to the next in a given system, each key telephone will have an identical wiring schedule or pattern within the interconnection system. The present invention therefore makes use of this high probability of similarity from station to station and utilizes similar printed circuits to establish the connections within an interconnection module. Of course, those additional service functions which do not fall into the wiring schedule of the bulk of the stations of a system may be treated and handled on a conventional basis with relative ease and greater wiring accuracy.

Therefore, according to the invention, in an interconnection module of the type wherein a plurality of patch-cord type connector contacts are mounted in an array of vertical and horizontal rows and a plurality of electrical connectors are mounted in an array of vertical and horizontal rows with the electrical contacts of the connector spaced from the patch-cord type connector contacts, a flexible printed circuit structure is interposed within the interconnection module and includes a plurality of printed circuits, each of which interconnect the individual patch-cord type contacts of a vertical row with corresponding contacts of a respective electrical connector. More specifically, and as would be utilized for a blue field as disclosed in the aforementioned Verhagen application, an electrical connection module comprises a front panel and a back panel spaced from and secured to the front panel, a plurality of first electrical contacts supported by the front panel in aligned rows and a plurality of electrical connector units supported by the back panel, the number of connector units being equal to the number of rows of the first electrical contacts. Each of the first electrical contacts extends through the front panel and includes a forward portion adapted to engage a cooperable mating contact of, for example, a patch-cord connector, and a rear portion, while each of the electrical connector units includes second electrical contacts which are aligned in rows and extend in the same direction as the rows of the first electrical contacts. Each of the second electrical contacts includes a rearwardly extending portion which is adapted to engage a cooperable mating contact of a mating connector unit and a forwardly extending portion. Means for interconnecting the contacts is provided in the form of a flexible printed circuit means which is disposed between the front and back panels and which includes a plurality of printed circuits which interconnect the forwardly extending portions of the second electrical contacts and the rear portions of the first electrical contacts of a row to electrically associate each row of first contacts with a separate connector unit.

As the invention would be applied to a different type of module, for example the red field disclosed in the aforementioned Verhagen application, an electrical interconnection module comprises a front panel and a back panel spaced from and secured to the front panel, a plurality of first electrical contacts supported by and extending through the front panel in rows which extend in first and second directions, and at least one electrical connector unit supported by the back panel. Each of the first electrical contacts includes a forward portion adapted to engage a cooperable mating contact and a rear portion, while the electrical connector unit includes a plurality of second electrical contacts, each of which extends through the back panel and has a forwardly extending portion and a rearwardly extending portion adapted to engage a corresponding contact of a mating connector unit. Flexible printed circuit means is disposed between the front and back panels and includes a plurality of individual printed circuits. Each of the printed circuits electrically connects a forwardly extending portion of a second contact with a rearwardly extending portion of a respective first contact of the first row direction and to all of the remainder of the rearwardly extending portions of first contacts aligned therewith in the second row direction.

For convenience, row directions and certain component orientations are discussed herein through the use of the terms horizontal and vertical; however, it is readily apparent to those skilled in the art that these are relative and non-limiting terms which are used only as an aid in describing the relative associations and relationships of the individual elements involved. For example, the interconnection module is illustrated in the drawing with its longitudinal dimension vertically oriented; it could just as well horizontally or obliquely oriented.

BRIEF DESCRIPTION OF THE DRAWINGS

Other objects, features and advantages of the invention, its organization, construction and operation will be best understood from the following detailed description of a preferred embodiment of the invention, taken in conjunction with the accompanying drawings, on which:

FIG. 1 is a longitudinal sectional view of an interconnection module constructed in accordance with the present invention;

FIG. 2 is a fragmentary portion of a front view of the front panel of the apparatus of FIG. 1 showing an array of patch-cord type contact units;

FIG. 3 is a sectional view taken substantially along the line III—III of FIG. 1;

FIG. 4 is a simplified plan view of a printed circuit arrangement which may be utilized in practicing the invention;

FIG. 5 is a fragmentary sectional view of the layer structure for a plurality of printed circuit structures such as illustrated in FIG. 4; and FIG. 6 is a fragmentary view of a flexible printed circuit structure as may be employed in utilizing the invention with a shorting bar feature.

DESCRIPTION OF THE PREFERRED EMBODIMENTS

Referring to FIGS. 1-3, an electrical interconnection module is generally illustrated at 10 as comprising a front panel 12, a rear panel 14 spaced from the front panel 12 by a plurality of spacers 16 to form a space between the panels, and secured thereto by suitable fastening means, such as the machine screws 18 and 20.

The front panel 12 includes a plurality of holes (not shown) which mount an array of patch-cord type contact units 22 arranged in vertical and horizontal rows. As a blue field in the aforementioned Verhagen application, each vertical row corresponds to a key telephone or the like, while each horizontal row, or combinations of horizontal rows, is associated with a particular key telephone function, such as ringing and other types of signaling.

Referring to FIG. 3 in particular, each patch-cord connector unit 22 is illustrated as comprising an insulator 24 in which is secured a contact 26. The contact 26 includes a forward end 28, here illustrated as a female contact, and a rearwardly extending end 30 extending into the space between the panels, here illustrated as a wrapping post. A patch-cord 34 includes a mating contact 34 which is received by and electrically connected to the forward portion 28 of the contact 26, as is well known in the art.

As can be seen in FIGS. 1—3, the particular interconnection module illustrated has six vertical rows of patch-cord connector units 22 and six separable electrical connectors 40 supported by the rear panel 14. These numbers are generally the same for a blue field, however, as explained in the aforementioned Verhagen application, a much greater number of patch-cord type connector units are associated with a single separable electrical connector because of shorting conductors and the like as will be dealt with below in connection with FIG. 6.

Each of the electrical connectors 40 includes a plurality of contacts 47 which are engageable with corresponding contacts of the mating connector unit 36. The connector unit 40 extends through a respective aperture 42 in the back panel 14 and is secured to the back panel 14 by suitable means, such as the machine screws 44. Likewise, the connector unit 36 may be secured, as illustrated at 46, to the back panel 14.

Referring in particular to FIGS. 1 and 3, electrical connections between the rearwardly extending contact portions 30 and the forwardly extending contact portions 48 are generally illustrated as being accomplished by way of a flexible printed circuit structure 50 which includes a first portion 52 disposed adjacent and generally parallel to the front panel 12, a second portion 54 disposed adjacent and generally parallel to the rear panel 14, and an intermediate portion 56 which joins the portions 52 and 54 and extends generally perpendicular to the front panel 12 and the back panel 14. As illustrated, printed circuit structure 50 is formed with a common side surface 57 which extends to both panels for receiving contact portions 30 and 48 in electrical engagement.

The printed circuit structure 50 is a multi-layer structure and may advantageously take the form illustrated in FIG. 5 which comprises a plurality of multi-layer structures 58.

Each of the multi-layer structures 58 includes a center layer 60 of insulating material, a pair of printed circuits 62 and 64 on each side of the center layer 60, and a pair of outer layers 66 and 68 covering the respective printed circuits 62 and 64 and preferably bonded to the center layer 60 to form a unitary structure. Each of the multi-layer structures 58 will therefore provide interconnections between two of the electrical connectors 36 and a corresponding pair of vertical rows of the patch-cord connectors units 22. For the six row, six connector structure illustrated in FIGS. 1-3, there would be three such multi-layer structures 58.

Referring to FIG. 4, one of the multi-layer structures 58 (with the outer layers 66 and 68 removed) illustrates one of the preferred printed circuit layouts for making the required interconnections. Each of the layers 58, are provided with a plurality of printed conductors 70 which extend from a connection pad 76 at one end thereof to a connection pad 78 at the other end thereof. Each of the multi-layer structures 58, including the outer layer 66 and 68, is provided with an array of holes 72 for receiving all of the contact portions 48 of the separable electrical connectors therethrough, and another array of holes 74 to receive the contact portions 30 therethrough. It will be appreciated that the holes 72 and 74 of one multi-layer structure 58 will be in registry with like holes in the other similar multi-layer structures.

In FIG. 4 the electrical interconnections of the printed circuit 62 on one side of the center layer 60 have been illustrated. In this illustration, the contact portions of a center positioned electrical connector are electrically connected to respective contact positions of a single vertical row of the contact portions 30 of the patch-cord connector units 22. As indicated by broken lines, the printed circuit 64 on the opposite side of this sheet connects the individual contacts of the connector lying directly below the above-mentioned connector to respective positions in a separate vertical row. For the embodiment illustrated herein which utilizes six vertical rows and six electrical connectors, three of these multi-layer structures would be used with the other two structures having a slightly different art work so that the left-hand connector positions illustrated in FIG. 4 would be connected to two respective and separate vertical rows and the two right-hand connector positions would be connected to two other separate vertical rows.

It will be appreciated that adjustments in the art work in the portions generally indicated at 52 and 54 are much easier to accomplish in the initial stages of preparing the printed circuits and that the registry of the holes in punching is a more critical parameter, particularly when the preferred form of the flexible interconnection circuitry includes the further step of bonding all multi-layer structures together before the electrical connections, by soldering or the like, are made to the contact portions 30 and 48.

Other techniques for utilizing this general type of flexible printed circuit have also been investigated, but are not illustrated in the drawing. For example, the individual multi-layer structures 58 may be separately connected to the appertaining electrical connector contacts, bent generally perpendicular to the rear panel 14 to extend toward the front panel 12 and then bent again to lie substantially as the portion 52 illustrated herein. With this structure, the individual multi-layer structures do no overlap on the rear panel side and have their intermediate portions 56 disposed at different angles so as to converge as they approach the front panel 12.

Another technique which has been explored involves the cutting out of large apertures to receive all of the contact portions of an electrical connector which is not to be electrically terminated to circuits carried by the multi-layer structures 58. In the apparatus illustrated in FIG. 4, this would involve removing material surrounding the four corner positioned connectors.

Also, if there is sufficient space and the printed circuit art work layout permits, additional rows of holes 74 may be provided in the portion 52 and holes for only the pertinent connectors in the portion 54 so that the same art work could be utilized for each vertically oriented pair of electrical connectors. This technique, however, would involve separate steps in interconnecting the circuits nearest the front panel 12 first, then the next adjacent circuit, and so on, the contact portions 48 being bent over parallel to the back panel 14 during each connection by soldering or the like.

Referring to FIG. 6, a slightly different type of printed circuit is generally illustrated at 80 for the area of the contact portions 30. This printed circuit layout is particularly useful for the red field type of module described in the aforementioned Verhagen application wherein there is a single electrical connector, such as the electrical connector 36 for a plurality of vertical rows and each of the contacts of the respective horizontal rows are shorted together. As illustrated in FIG. 6 a center layer 82 of insulating material includes an array of holes 84 which are comparable to the holes 74 in FIG. 4. Each horizontal row of holes is surrounded by a printed strip 86 of conductive material so that all of the contact portions extending through a respective row of holes 84 may be electrically connected together. Each of the "shorting bars" 86 is extended to a respective contact portion, such as the contact portion 48 of the electrical connector 36, by way of a respective printed conductor 88, in a manner generally illustrated on the left hand side of FIG. 4, which in this case would accommodate a single electrical connector.

Although I have described my invention by reference to particular illustrative embodiments thereof, many changes and modifications, other than those listed above, may become apparent to those skilled in the art without departing from the spirit and scope of the invention. I therefore intend to include within the patent warranted hereon all such changes and modifications as may reasonably and properly be included within the scope of my contribution to the art.

I claim:

1. An electrical interconnection module, comprising:
   a front panel and a back panel spaced from and secured to said front panel and forming a space between said panels;
   a plurality of first electrical/contacts extending through and supported in aligned rows by said front panel with forward portions for engagement with external mating contacts and rear portions disposed in said space;
   a plurality of second electrical contacts extending through and supported by said back panel with forwardly extending portions disposed in said space and rearwardly extending portions for engagement with external mating contacts, said second electrical contacts supported in groups; and
   flexible printed circuit means disposed between said front and back panels and being formed with a surface extending between said panels for receiving said rear portions of said first contacts and said forwardly extending portions of said seond contacts, and printed circuit means comprising at least one layer of insulating material and at least one pair of printed circuits on respective sides of said layer and extending between said first contacts of at least two of said rows and said second contacts of at least two of said groups, each of said printed circuits individually connecting said first electrical contacts of a row with said second contacts of a respective group of second contacts.

2. The interconnection module of claim 1, wherein said groups of second contacts are aligned in rows of groups
   parallel to the rows of said first contacts.

3. The interconnection module of claim 1, comprising electrical connector units mounted on said back panel, each of said connector units including a respective group of second contacts.

4. The interconnection module of claim 1, wherein said flexible printed circuit means comprises a multi-layer structure including
a center layer of insulating material as said one layer with said pair of said printed circuits being on opposite sides of said center layer; and
a pair of outer layers of insulating materials, each of said outer layers covering a respective printed circuit and bonded to said center layer.

5. The interconnection module of claim 4, wherein said flexible printed circuit means comprises a plurality of said multi-layer structures positioned in a stacked arrangement.

6. The interconnection module of claim 5, wherein said plurality of multi-layer structures are bonded together to form a single flexible printed circuit unit.

7. The interconnection module of claim 5, wherein each of said multi-layer structures is substantially coextensive with the other multi-layer structures and comprises:
a first portion with a plurality of first holes positioned adjacent the front panel to receive said first electrical contacts therethrough; and
a second portion with a plurality of second holes positioned adjacent the back panel to receive said second electrical contacts therethrough,
said first and second holes being in registry with the first and second holes of the other multi-layer structures.

8. The interconnection module of claim 7, wherein said plurality of multi-layer structures is bonded together to form a single flexible printed circuit unit.

9. The interconnection module of claim 8, wherein said flexible printed circuit means includes a first portion extending parallel to said front panel, a second portion extending parallel to said back panel and a third portion extending between said first and second portions.

10. An electrical interconnection module, comprising:
a front panel and a back panel spaced from and secured to said front panel;
a plurality of first electrical contacts supported by said front panel in rows extending in first and second directions, each of said first electrical contacts extending through said front panel and including a forward portion adapted to engage an external mating contact and a rear portion;
at least one electrical connector unit supported by said back panel, said connector unit including a plurality of second electrical contacts each having a forwardly extending portion and a rearwardly extending portion adapted to engage a corresponding contact of an external mating connector unit; and
flexible printed circuit means disposed between said front and back panels, said printed circuit means including a multi-layer structure with at least one layer of insulating material and a plurality of individual printed circuits on respective sides of said layer, each electrically connecting a forwardly extending portion of a second contact with a rearwardly extending portion of a respective first contact of the first row direction and to all of the remainder of said rearwardly extending portions of first contacts aligned therewith in the second row direction.

11. An electrical interconnection module, comprising a front panel and a back panel spaced from and secured to said front panel and forming a space between said panels;
a plurality of first electrical contacts extending through into said space and supported in aligned rows by said front panel, said contacts including forward programmable portions adapted to engage external mating contacts and rear portions;
a plurality of electrical connector units supported by said back panel, said connector units including second electrical contacts supported in groups and extending into said space, each group of said contacts including forwardly extending portions and rearwardly extending portions adapted to engage contacts of an external mating connector unit; and
flexible printed circuit means disposed between said front and back panels, said printed circuit means comprising at least one layer of insulating material and at least one pair of printed circuits on respective sides of said layer and extending between said first contacts of at least two of said rows and said second contacts of at least two of said connector units, each of said printed circuits individually connecting said first electrical contacts of a row with said second contacts of a respective connector unit.

12. The interconnection module of claim 11 wherein said flexible printed circuit means includes a first portion extending substantially parallel to said front panel, a second portion extending substantially parallel to said back panel and a third portion extending between said first and second portions, said printed circuit means being formed with one side surface extending adjacent said panels for receiving said first and second contacts.

13. The interconnection module of claim 12 wherein said flexible printed circuit means comprises a plurality of multi-layer structures, each structure including a center layer of insulating material and a pair of said printed circuits on opposite sides of said center layer.

14. The interconnection module of claim 12 wherein said first and second contacts extend through said side surface and at least one printed circuit for the connection of said first and second contacts.

* * * * *